United States Patent
Kumar et al.

(10) Patent No.: US 10,515,971 B2
(45) Date of Patent: Dec. 24, 2019

(54) FLASH MEMORIES AND METHODS FOR MANUFACTURING THE SAME

(71) Applicant: Vanguard International Semiconductor Corporation, Hsinchu (TW)

(72) Inventors: Ankit Kumar, Ranchi (IN); Manoj Kumar, Dhanbad (IN); Chia-Hao Lee, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/837,458

(22) Filed: Dec. 11, 2017

(65) Prior Publication Data

US 2019/0181148 A1 Jun. 13, 2019

(51) Int. Cl.
*H01L 27/11517* (2017.01)
*H01L 29/66* (2006.01)
(Continued)

(52) U.S. Cl.
CPC .. *H01L 27/11517* (2013.01); *H01L 29/40114* (2019.08); *H01L 29/42324* (2013.01); *H01L 29/66825* (2013.01); *H01L 29/7883* (2013.01)

(58) Field of Classification Search
CPC ......... H01L 27/11517; H01L 29/42336; H01L 21/0223; H01L 21/02164; H01L 21/266; H01L 21/26513; H01L 21/28273; H01L 21/30604; H01L 29/4916; H01L 29/66825; H01L 29/7881; H01L 21/02255;
(Continued)

(56) References Cited

U.S. PATENT DOCUMENTS

| | | | |
|---|---|---|---|
| 2003/0124801 A1* | 7/2003 | Lin | H01L 21/28273 438/257 |
| 2003/0235954 A1* | 12/2003 | Chuang | H01L 21/28273 438/259 |
| 2007/0161189 A1* | 7/2007 | Kim | H01L 21/28273 438/257 |

FOREIGN PATENT DOCUMENTS

| | | |
|---|---|---|
| CN | 1870270 A | 11/2006 |
| TW | 519755 B | 2/2003 |

(Continued)

OTHER PUBLICATIONS

Taiwanese Office Action and Search Report for Taiwanese Application No. 107101213, dated May 16, 2018.

*Primary Examiner* — Mouloucoulaye Inoussa
(74) *Attorney, Agent, or Firm* — Birch, Stewart, Kolasch & Birch, LLP

(57) ABSTRACT

A method for manufacturing a flash memory includes forming a first conductive layer on a semiconductor substrate, and forming a patterned mask layer on the first conductive layer, wherein the first conductive layer is exposed by an opening of the patterned mask layer. The method also includes forming a second conductive layer on the patterned mask layer, wherein the second conductive layer extends into the opening. The method further includes performing a first etching process on the second conductive layer to form a spacer on a sidewall of the opening, and performing an oxidation process to form an oxide structure in the opening. In addition, the method includes performing a second etching process by using the oxide structure as a mask to form a floating gate, and forming a source region and a drain region in the semiconductor substrate.

12 Claims, 4 Drawing Sheets

(51) Int. Cl.
*H01L 29/423* (2006.01)
*H01L 21/28* (2006.01)
*H01L 29/788* (2006.01)

(58) Field of Classification Search
CPC ........... H01L 29/42324; H01L 29/7885; H01L 27/115; H01L 29/6682
USPC ................. 438/257, 259, E21.209, E29.129; 257/316, E21.209, E29.129, E29.306, 257/E21.422, E27.103
See application file for complete search history.

(56) References Cited

FOREIGN PATENT DOCUMENTS

TW 200701442 A 1/2007
TW 200709392 A 1/2007

\* cited by examiner

FLASH MEMORIES AND METHODS FOR MANUFACTURING THE SAME

BACKGROUND

Field of the Invention

The invention relates to flash memories, and in particular to embedded flash (e-flash) memories having a floating gate with sharp tips and methods for manufacturing the same.

Description of the Related Art

A flash memory is a kind of non-volatile memory (NVM). Generally, a flash memory comprises two gates, the first gate is a floating gate (FG) for data storage and the second gate is a control gate for data input/output. The floating gate is placed under the control gate and "floats". Floating refers to isolating the floating gate and surrounding it with insulating materials for preventing charge loss. The control gate is connected to a word line (WL) for device control. One advantage of flash memories is block-by-block erasing. Flash memory is widely used in enterprise servers, storage and networking technology, and a wide range of consumer electronic products, such as USB flash drives, mobile phones, digital cameras, tablet computers, PC cards in notebook computers, and embedded controllers, for example.

There are several kinds of non-volatile memory available in the market, such as flash memory, electrically erasable programmable read-only memory (EEPROM) and multi-time programmable (MTP) non-volatile memory. However, embedded flash (e-flash) memory and especially embedded split-gate flash memory shows dominance over other non-volatile memory technologies.

Although existing flash memories and methods for manufacturing the same have been adequate for their intended purposes, they have not been entirely satisfactory in all respects. Therefore, up to the present, there are still some problems to be overcome in regards to the technologies of flash memories.

BRIEF SUMMARY

Embodiments of flash memories and methods for manufacturing the same are provided, especially an embedded split-gate flash memory. In some embodiments of the present disclosure, a spacer is formed on a sidewall of an opening. Then, a portion of the spacer is oxidized during an oxidation process for forming an oxide structure in the opening. After the oxidation process has been performed, the remaining portion of the spacer has a concave surface facing the oxide structure thereon, and a complete floating gate with a vertical sharp tip is formed after a subsequent etching process.

In the foregoing method, the spacer is used to form the sharp tip of the floating gate, and the erase efficiency of the device is dependent on the sharpness of the sharp tip. Thus, in order to make sure that the sharp tip is sharp enough, the duration of the oxidation process can be shortened due to the existence of the spacer, and the thickness of the floating gate under the oxide structure may not be too small. As a result, the flash memory having the floating gate with the sharp tip formed by the foregoing method may offer advantages like improving the erase efficiency of the device, increasing the overall performance of the device, and being easy to embed in any flash memory processes.

Moreover, in some embodiments of the present disclosure, the oxide structure is formed before the complete formation of the floating gate, and the oxide structure can be used as a mask during the etching process for forming the floating gate. Therefore, there is no extra mask needed to create the sharp tip and the cost of the process can be reduced.

Some embodiments of the disclosure provide a method for manufacturing a flash memory. The method includes forming a first conductive layer on a semiconductor substrate, and forming a patterned mask layer on the first conductive layer, wherein the first conductive layer is exposed by an opening of the patterned mask layer. The method also includes forming a second conductive layer on the patterned mask layer, wherein the second conductive layer extends into the opening. The method further includes performing a first etching process on the second conductive layer to form a spacer on a sidewall of the opening, and performing an oxidation process to form an oxide structure in the opening. In addition, the method includes performing a second etching process by using the oxide structure as a mask to form a floating gate, and forming a source region and a drain region in the semiconductor substrate.

Some embodiments of the disclosure provide a flash memory. The flash memory includes a floating gate disposed on a semiconductor substrate, wherein a first edge of the floating gate is a first sharp tip, and a second edge of the floating gate is a second sharp tip. The flash memory also includes an oxide structure disposed on the floating gate, wherein a first protruding portion of the oxide structure is located directly above the first sharp tip, and a second protruding portion of the oxide structure is located directly above the second sharp tip. The flash memory further includes a source region and a drain region disposed in the semiconductor substrate, and the floating gate is located between the source region and the drain region.

A detailed description is given in the following embodiments with reference to the accompanying drawings.

BRIEF DESCRIPTION OF THE DRAWINGS

The disclosure can be more fully understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
FIGS. 1 to 8 are cross-sectional views illustrating intermediate stages of a method for manufacturing the flash memory of FIG. 8 in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Figure 6:
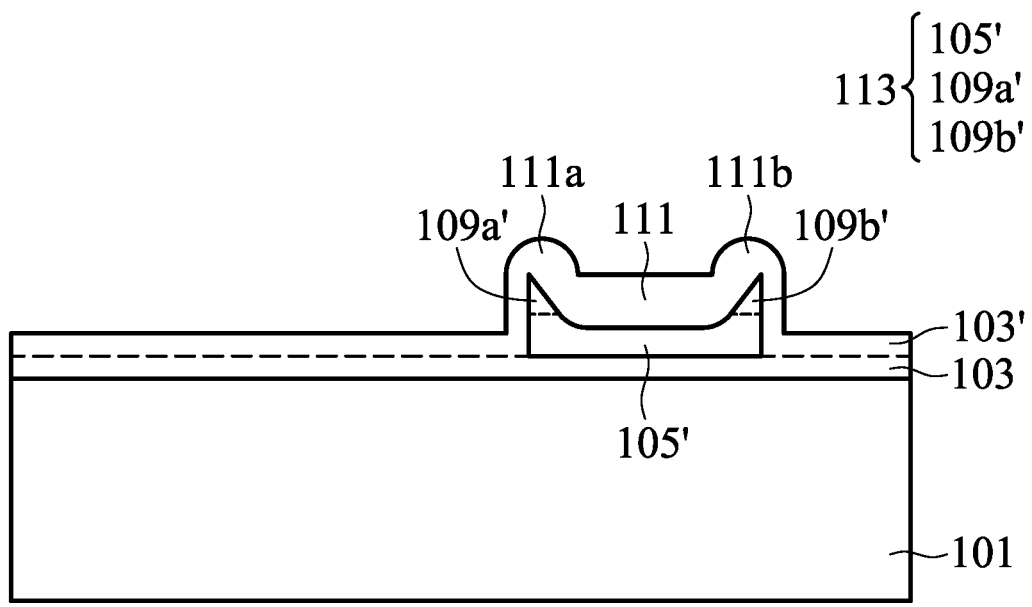
Figure 7:
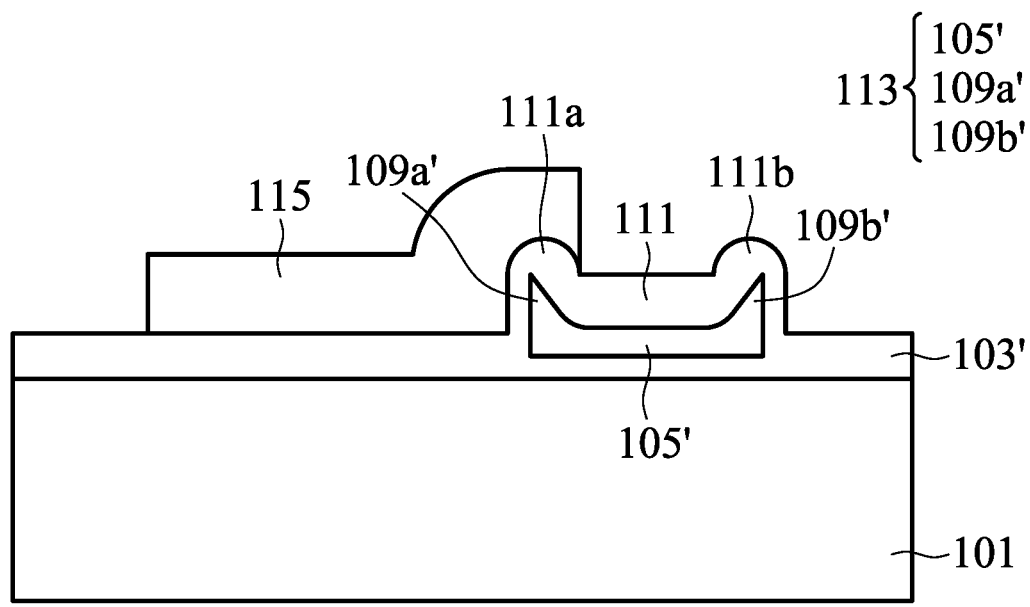
Figure 8:
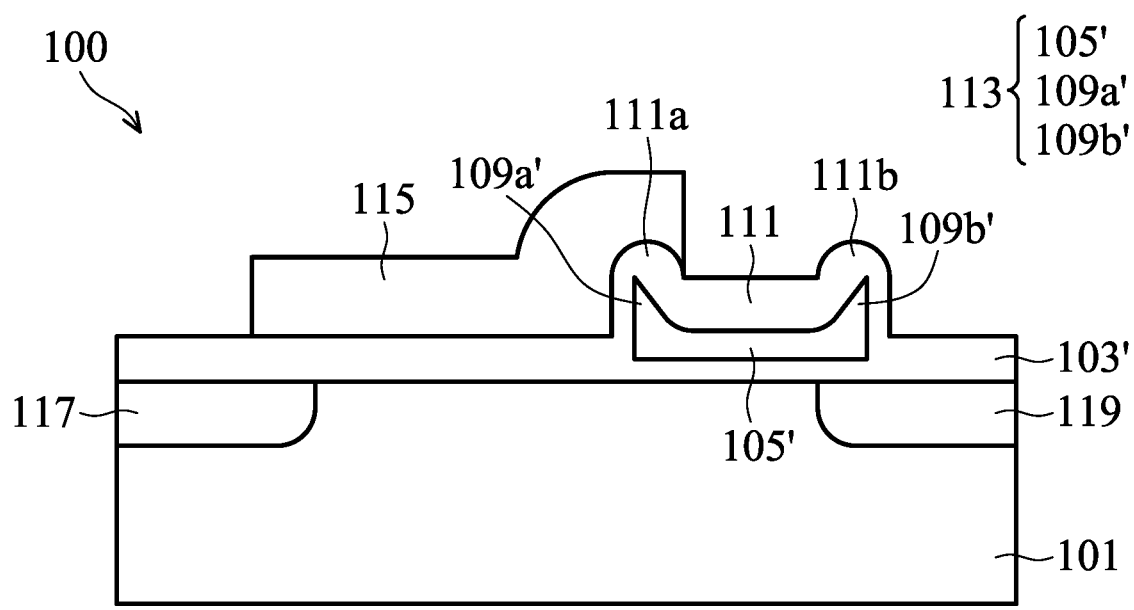

FIGS. 1 to 8 are cross-sectional views illustrating intermediate stages of a method for manufacturing a flash memory 100 of FIG. 8 in accordance with some embodiments.

As shown in FIG. 1, a semiconductor substrate 101 is provided, in accordance with some embodiments. In some embodiments, the semiconductor substrate 101 may be made of silicon or another semiconductor material. Alternatively, the semiconductor substrate 101 may include other elementary semiconductor materials such as germanium (Ge). In some embodiments, the semiconductor substrate 101 is made of a compound semiconductor such as silicon carbide, gallium nitride, gallium arsenic, indium arsenide, or indium phosphide. In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 includes a silicon-on-insulator (SOI) substrate.

In some embodiments, the semiconductor substrate 101 has a first conductivity type, for example, the semiconductor substrate 101 is a lightly doped p-type substrate in the present embodiment. However, in other embodiments, the semiconductor substrate 101 may be a lightly doped n-type substrate.

Figure 2:
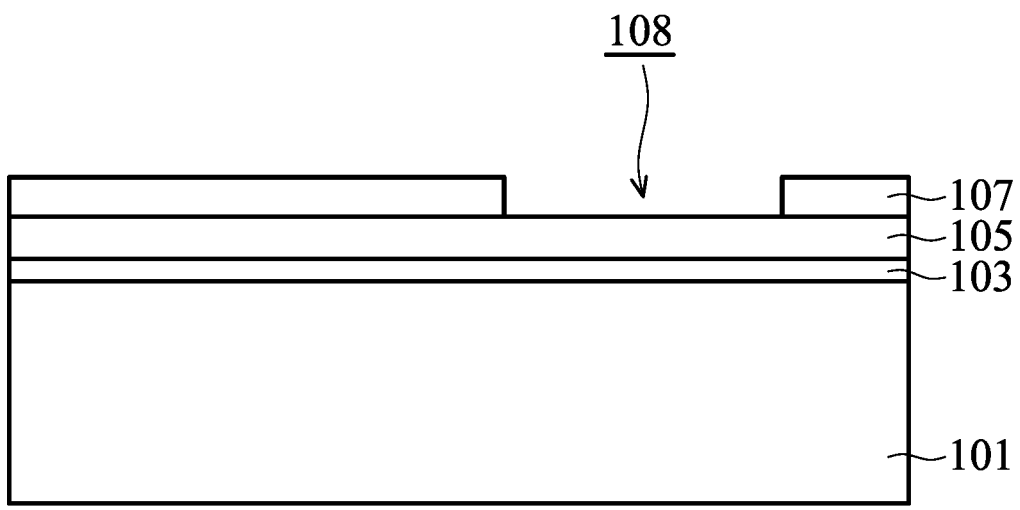

Next, as shown in FIG. 2, a dielectric layer 103 is formed on the semiconductor substrate 101, in accordance with some embodiments. In some embodiments, the dielectric layer 103 may be made of silicon oxide, silicon nitride, silicon oxynitride or another applicable dielectric material. Moreover, the dielectric layer 103 may be formed by a thermal oxidation process, a chemical vapor deposition (CVD) process, or a combination thereof.

Then, a first conductive layer 105 is formed on the dielectric layer 103. In some embodiments, the first conductive layer 105 may be made of polysilicon. However, in other embodiments, the first conductive layer 105 may be made of another applicable conductive material, such as a metal material. The first conductive layer 105 may be formed by a deposition process, such as a chemical vapor deposition process, a physical vapor deposition (PVD) process, an atomic layer deposition (ALD) process, a low pressure chemical vapor deposition (LPCVD) process, a high density plasma chemical vapor deposition (HDPCVD) process, a metal organic chemical vapor deposition (MOCVD) process, a plasma enhanced chemical vapor deposition (PECVD) process, or a combination thereof.

Still referring to FIG. 2, after forming the first conductive layer 105, a mask layer (not shown) is formed on the first conductive layer 105. Then, the mask layer is patterned by performing a patterning process to form a patterned mask layer 107 with an opening 108 therein. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

In some embodiments, the patterned mask layer 107 may be made of nitride, such as silicon nitride, or another applicable material. It should be noted that a portion of the first conductive layer 105 is exposed by the opening 108 of the patterned mask layer 107, and the opening 108 is formed to define the location where a floating gate is planned to be formed subsequently.

Figure 3:
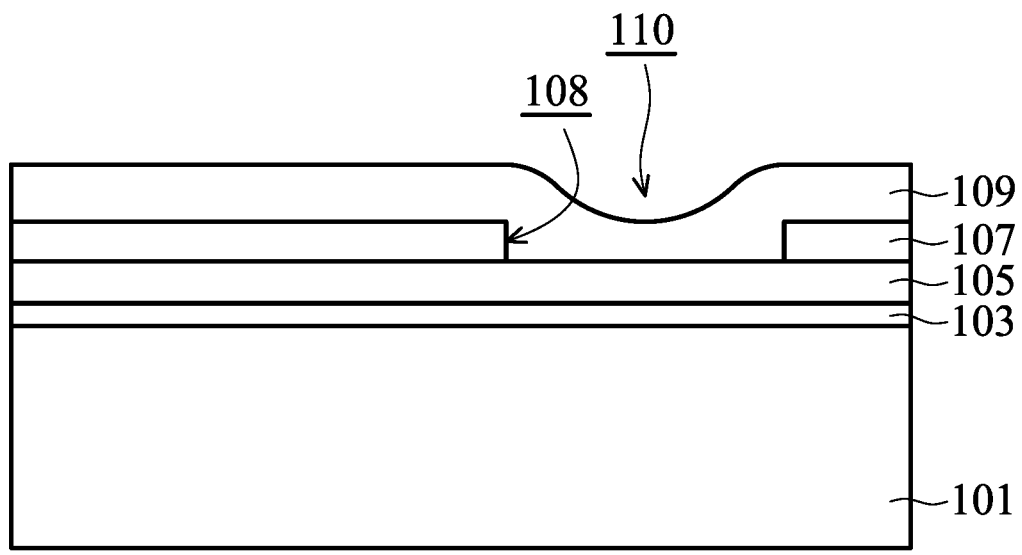

Next, as shown in FIG. 3, a second conductive layer 109 is formed on the patterned mask layer 107, in accordance with some embodiments. Moreover, the second conductive layer 109 extends into the opening 108 of the patterned mask layer 107. In other words, the second conductive layer 109 is formed overlying the patterned mask layer 107 and the portion of the first conductive layer 105 exposed by the opening 108.

In some embodiments, the portion of the first conductive layer 105 exposed by the opening 108 is fully covered by the second conductive layer 109, and the second conductive layer 109 has a recess 110 directly above the location of the opening 108. More specifically, the recess 110 is located in the range of the opening 108.

Some materials and processes used to form the second conductive layer 109 are similar to, or the same as, those used to form the first conductive layer 105, and are not repeated herein. In some embodiments, the first conductive layer 105 and the second conductive layer 109 are made of the same material, such as polysilicon.

Figure 4:
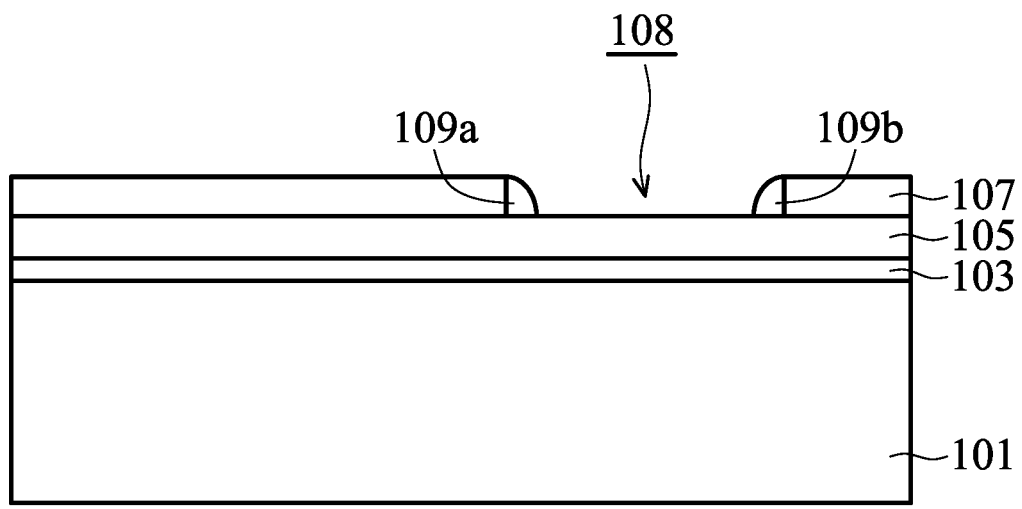

As shown in FIG. 4, a first etching process is performed on the second conductive layer 109 to remove the second conductive layer 109 overlying the patterned mask layer 107. Moreover, a portion of the second conductive layer 109 filled in the opening 108 is also removed by the etching process, leaving a first spacer 109a and a second spacer 109b on the opposite sidewalls of the opening 108. In other words, the first spacer 109a and the second spacer 109b are formed by the second conductive layer 109.

In some embodiments, the first spacer 109a and the second spacer 109b may have the same heights as that of the patterned mask layer 107. In other embodiments, the heights of the first spacer 109a and the second spacer 109b may smaller than that of the patterned mask layer 107.

In some embodiments, the first etching process may include a dry etching process or a wet etching process. As a result, a portion of the top surface of the first conductive layer 105 is exposed by the opening 108 again after performing the first etching process. Moreover, as shown in FIG. 4, the first spacer 109a and the second spacer 109b have convex surfaces facing the center of the opening 108.

Figure 5:
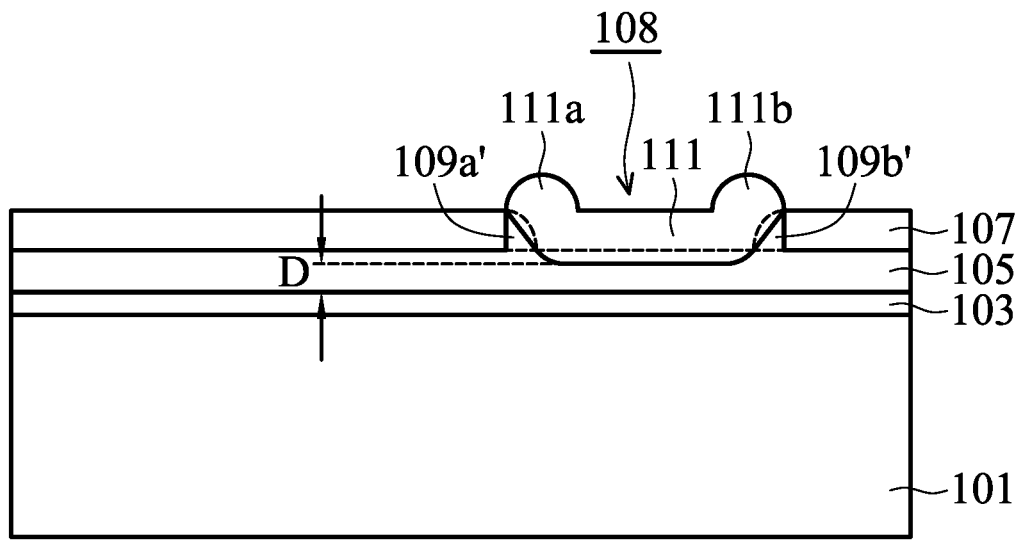

As shown in FIG. 5, an oxidation process is performed to form an oxide structure 111 in the opening 108, in accordance with some embodiment. During the oxidation process, a portion of the first spacer 109a, a portion of the second spacer 109b and a portion of the first conductive layer 105 under the location of the opening 108 are oxidized and transformed into the oxide structure 111. As a result, the bottom surface of the oxide structure 111 is lower than the bottom surface of the patterned mask layer 107, and the remaining portion of the first spacer (also called a first sharp tip) 109a' and the remaining portion of the second spacer (also called a second sharp tip) 109b' have concave surfaces facing the oxide structure 111.

The remaining portion of the first spacer 109a' and the remaining portion of the second spacer 109b' are the sharp tips of the floating gate 113 (as shown in FIG. 6). It should be noted that the formation of the floating gate 113 has not yet been completed at the stage shown in FIG. 5. Since the first spacer 109a and the second spacer 109b can provide the heights of the first sharp tip 109a' and the second sharp tip 109b', the duration of the oxidation process can be shortened, and the thickness of the first conductive layer 105 under the oxide structure 111 may not be too small.

In other words, the shortest distance D between the oxide structure 111 and the dielectric layer 103 can be maintained at a sufficient level, and the sharpness of the first sharp tip 109a' and the second sharp tip 109b' may be enough. As a result, an improved erase efficiency of the device can be achieved.

Moreover, referring to FIG. 5, the oxide structure 111 includes a first protruding portion 111a and a second protruding portion 111b that protrude from the top surface of the patterned mask layer 107. It should be noted that the first protruding portion 111a is located directly above the first sharp tip 109a', and the second protruding portion 111b is located directly above the second sharp tip 109b'. The first protruding portion 111a and the second protruding portion 111b are located at opposite edges of the oxide structure 111.

Specifically, the first protruding portion 111a and the second protruding portion 111b have rounded top surfaces. In some embodiments, the top surfaces of the first protruding portion 111a and the second protruding portion 111b may be hemispherical or semi-ellipsoid.

In addition, in this embodiment, the oxide structure 111 may also include a flat top surface between the first protruding portion 111a and the second protruding portion 111b, and the flat top surface is lower than the top surfaces of the first protruding portion 111a and the second protruding portion 111b.

Next, as shown in FIG. 6, a second etching process is performed by using the oxide structure 111 as a mask to complete the formation of the floating gate 113. In some embodiments, the second etching process may include a dry etching process or a wet etching process. After the second etching process, the patterned mask layer 107 and the portion of the first conductive layer 105 under the patterned mask layer 107 are removed.

More specifically, the patterned mask layer 107 and the portion of the first conductive layer 105 not covered by the oxide structure 111 are etched away, and the remaining portion of the first conductive layer 105', the first sharp tip 109a', and the second sharp tip 109b' compose the floating gate 113. Once the second etching process is finished, the floating gate 113 is completed, and the first sharp tip 109a' and the second sharp tip 109b' are located at opposite edges of the floating gate 113.

Still referring to FIG. 6, after the second etching process, another dielectric layer is formed to cover the sidewalls of the floating gate 113. The dielectric layer on the sidewalls of the floating gate 113 and the dielectric layer 103 formed previously may combine to form a dielectric structure 103'. In this embodiment, the floating gate 113 is entirely surrounded by the dielectric structure 103' and the oxide structure 111.

As shown in FIG. 7, a control gate 115 is formed on the dielectric structure 103', in accordance with some embodiments. In some embodiments, the control gate 115 extends onto the oxide structure 111. More specifically, the control gate 115 covers the first protruding portion 111a of the oxide structure 111, and the second protruding portion 111b of the oxide structure 111 is not covered by the control gate 115. It should be noted that the control gate 115 is separated from the floating gate 113 by the dielectric structure 103' and the oxide structure 111.

In some embodiments, a third conductive layer (not shown) is formed overlying the dielectric structure 103' and the oxide structure 111. Then, the third conductive layer is patterned to form the control gate 115. The patterning process of the third conductive layer is similar to, or the same as, those used to form the patterned mask layer 107, and are not repeated herein. In this embodiment, the thickness of the control gate 115 is greater than the thickness of the floating gate 113, and the length of the control gate 115 is greater than the length of the floating gate 113.

Some materials and processes used to form the third conductive layer are similar to, or the same as, those used to form the first conductive layer 105 and the second conductive layer 109, and are not repeated herein. In some embodiments, the first conductive layer 105, the second conductive layer 109 and the third conductive layer are made of the same material, such as polysilicon.

Next, as shown in FIG. 8, a source region 117 and a drain region 119 are formed by implanting ions into the semiconductor substrate 101, in accordance with some embodiments. The floating gate 113 and the control gate 115 are located between the source region 117 and the drain region 119.

In the present embodiment, the semiconductor substrate 101 is a p-type substrate, and the source region 117 and the drain region 119 are formed by implanting n-type dopants, such as phosphorous (P) or arsenic (As), in the semiconductor substrate 101. In other embodiments, the semiconductor substrate 101 is an n-type substrate, and the source region 117 and the drain region 119 are formed by implanting p-type dopants, such as boron (B), in the semiconductor substrate 101. The conductivity type of the semiconductor substrate 101 is opposite to the conductivity type of the source region 117 and the drain region 119. Once the source region 117 and the drain region 119 are formed, the flash memory 100 is complete.

In some embodiments of the present disclosure, a spacer is formed on a sidewall of an opening. Then, a portion of the spacer is oxidized during an oxidation process for forming an oxide structure in the opening. After the oxidation process has been performed, the remaining portion of the spacer has a concave surface facing the oxide structure thereon, and a complete floating gate with a vertical sharp tip is formed after a subsequent etching process.

In the foregoing method, the spacer is used to form the sharp tip of the floating gate, and the erase efficiency of the device is dependent on the sharpness of the sharp tip. Thus, in order to make sure that the sharp tip is sharp enough, the duration of the oxidation process can be shortened due to the existence of the spacer, and the thickness of the floating gate under the oxide structure may not be too small. As a result, the flash memory having the floating gate with the sharp tip formed by the foregoing method may offer advantages like improving the erase efficiency of the device, increasing the overall performance of the device, and being easy to embed in any flash memory processes.

Moreover, in some embodiments of the present disclosure, the oxide structure is formed before the complete formation of the floating gate, and the oxide structure can be used as a mask during the etching process for forming the floating gate. Therefore, there is no extra mask needed to create the sharp tip and the cost of the process can be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a flash memory, comprising:
   forming a first conductive layer on a semiconductor substrate;
   forming a patterned mask layer on the first conductive layer, wherein the first conductive layer is exposed by an opening of the patterned mask layer;
   forming a second conductive layer on the patterned mask layer, wherein the second conductive layer extends into the opening;
   performing a first etching process on the second conductive layer to form a spacer on a sidewall of the opening;
   performing an oxidation process to form an oxide structure in the opening, wherein the oxide structure comprises a plurality of protruding portions located at opposite edges of the oxide structure and an intermediate portion between and lower than the plurality of protruding portions, wherein the plurality of protruding portions protrude from a top surface of the patterned mask layer;
   performing a second etching process by using the oxide structure as a mask to form a floating gate; and
   forming a source region and a drain region in the semiconductor substrate.

2. The method as claimed in claim 1, wherein the second conductive layer has a recess directly above the opening of the patterned mask layer before performing the first etching process.

3. The method as claimed in claim 1, wherein the patterned mask layer and a top surface of the first conductive layer are exposed after performing the first etching process.

4. The method as claimed in claim 1, wherein the spacer has a convex surface facing a center of the opening before performing the oxidation process.

5. The method as claimed in claim 1, wherein a portion of the spacer and a portion of the first conductive layer under the opening are transformed into the oxide structure during the oxidation process.

6. The method as claimed in claim 1, wherein a bottom surface of the oxide structure is lower than a bottom surface of the patterned mask layer.

7. The method as claimed in claim 1, wherein after performing the oxidation process, a remaining portion of the spacer has a concave surface facing the oxide structure.

8. The method as claimed in claim 1, wherein the patterned mask layer and a portion of the first conductive layer covered by the patterned mask layer are removed during the second etching process.

9. The method as claimed in claim 1, wherein the spacer and the first conductive layer are made of the same material, and the floating gate is composed of a remaining portion of the spacer and a remaining portion of the first conductive layer after performing the second etching process.

10. The method as claimed in claim 1, wherein the source region and the drain region are formed by implanting ions into the semiconductor substrate, and the floating gate is located between the source region and the drain region.

11. The method as claimed in claim 1, further comprising:
    forming a dielectric layer to cover a sidewall of the floating gate; and
    forming a control gate on the semiconductor substrate, wherein the control gate extends onto the oxide structure.

12. The method as claimed in claim 11, wherein the control gate covers one of the plurality of protruding portions of the oxide structure, and the one of the plurality of protruding portions has a rounded top surface, and wherein the control gate is separated from the floating gate by the dielectric layer.

* * * * *